United States Patent
Koval et al.

(10) Patent No.: US 9,082,714 B2
(45) Date of Patent: Jul. 14, 2015

(54) USE OF ETCH PROCESS POST WORDLINE DEFINITION TO IMPROVE DATA RETENTION IN A FLASH MEMORY DEVICE

(75) Inventors: Randy J. Koval, Boise, ID (US); Max F. Hineman, Boise, ID (US); Ronald A. Weimer, Boise, ID (US); Vinayak K. Shamanna, Boise, ID (US); Thomas M. Graettinger, Boise, ID (US); William R. Kueber, Boise, ID (US); Christopher Larsen, Boise, ID (US); Alex J. Schrinsky, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/993,444

(22) PCT Filed: Sep. 22, 2011

(86) PCT No.: PCT/US2011/052850
§ 371 (c)(1),
(2), (4) Date: Jun. 12, 2013

(87) PCT Pub. No.: WO2013/043184
PCT Pub. Date: Mar. 28, 2013

(65) Prior Publication Data
US 2013/0264628 A1    Oct. 10, 2013

(51) Int. Cl.
*H01L 21/76* (2006.01)
*H01L 21/306* (2006.01)
(Continued)

(52) U.S. Cl.
CPC .......... *H01L 21/30604* (2013.01); *H01L 21/76* (2013.01); *H01L 27/11521* (2013.01); *H01L 27/11568* (2013.01); *H01L 29/513* (2013.01);
(Continued)

(58) Field of Classification Search
CPC ................ H01L 23/4821; H01L 21/76; H01L 27/10844
USPC ........................................... 257/305; 438/421
See application file for complete search history.

(56) References Cited

U.S. PATENT DOCUMENTS 4,894,697 A * 1/1990 Chin et al. ..................... 257/302
8,461,016 B2 * 6/2013 Mathew et al. ............... 438/427
(Continued)

FOREIGN PATENT DOCUMENTS

JP        2010-225786 A       7/2010

OTHER PUBLICATIONS

International Search Report and Written Opinion mailed Apr. 27, 2012 from International Application No. PCT/US2011/052850.
(Continued)

*Primary Examiner* — Mohammad Choudhry
(74) *Attorney, Agent, or Firm* — Schwabe, Williamson & Wyatt, P.C.

(57) ABSTRACT

Embodiments of the present disclosure are directed towards use of an etch process post wordline definition to improve data retention in a flash memory device. In one embodiment, a method includes forming a plurality of wordline structures on a substrate, wherein individual wordline structures of the plurality of wordline structures include a control gate having an electrically conductive material and a cap having an electrically insulative material formed on the control gate, depositing an electrically insulative material to form a liner on a surface of the individual wordline structures, and etching the liner to remove at least a portion of the liner. Other embodiments may be described and/or claimed.

5 Claims, 7 Drawing Sheets

(51) Int. Cl.
*H01L 29/51* (2006.01)
*H01L 29/788* (2006.01)
*H01L 29/792* (2006.01)
*H01L 27/115* (2006.01)

(52) U.S. Cl.
CPC .......... *H01L 29/788* (2013.01); *H01L 29/7881* (2013.01); *H01L 29/792* (2013.01)

(56) References Cited

U.S. PATENT DOCUMENTS

| | | |
|---|---|---|
| 2004/0046206 A1 | 3/2004 | Yun et al. |
| 2007/0111449 A1* | 5/2007 | Yu et al. ........................ 438/264 |
| 2008/0157181 A1 | 7/2008 | Kim et al. |
| 2010/0172183 A1* | 7/2010 | Lue et al. ................. 365/185.18 |
| 2010/0237398 A1 | 9/2010 | Kamigaichi et al. |
| 2012/0126303 A1* | 5/2012 | Arai et al. ..................... 257/316 |

OTHER PUBLICATIONS

Notification Concerning Transmittal of International Preliminary Report on Patentability mailed on Apr. 4, 2014 from International Application No. PCT/US2011/052850.

Korean Office Action with English Translation, mailed Feb. 24, 2015, issued in corresponding Korean Patent Application No. 10-2014-7007525, 18 pages.

* cited by examiner

USE OF ETCH PROCESS POST WORDLINE DEFINITION TO IMPROVE DATA RETENTION IN A FLASH MEMORY DEVICE

CROSS REFERENCE TO RELATED APPLICATIONS

The present application is a national phase entry under 35 U.S.C. §371 of International Application No. PCT/US2011/052850, filed Sep. 22, 2011, entitled "Use Of Etch Process Post Wordline Definition To Improve Data Retention In A Flash Memory Device", which designates the United States of America, the entire content of which is hereby incorporated by reference in its entirety.

FIELD

Embodiments of the present disclosure generally relate to the field of integrated circuits, and more particularly, to techniques and configurations relating to use of an etch process post wordline definition to improve data retention in a flash memory device.

BACKGROUND

Presently, memory devices such as flash memory devices may experience data retention issues. For example, some memory devices may experience charge loss due to wordline coupling or shorts caused by contamination of active areas of the memory device. Techniques and associated configurations that increase data retention in memory devices are needed.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure provide techniques and configurations relating to use of an etch process post wordline definition to improve data retention in a flash memory device. In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations are described as multiple discrete operations in turn, in a manner that is most helpful in understanding the claimed subject matter. However, the order of description should not be construed as to imply that these operations are necessarily order dependent. In some embodiments, the operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom or side. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first structure formed on a second structure," may mean that the first structure is formed over the second structure, and at least a part of the first structure may be in direct contact (e.g., direct physical and/or electrical contact) or indirect contact (e.g., having one or more other structures between the first structure and the second structure) with at least a part of the second structure.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Figure 1:
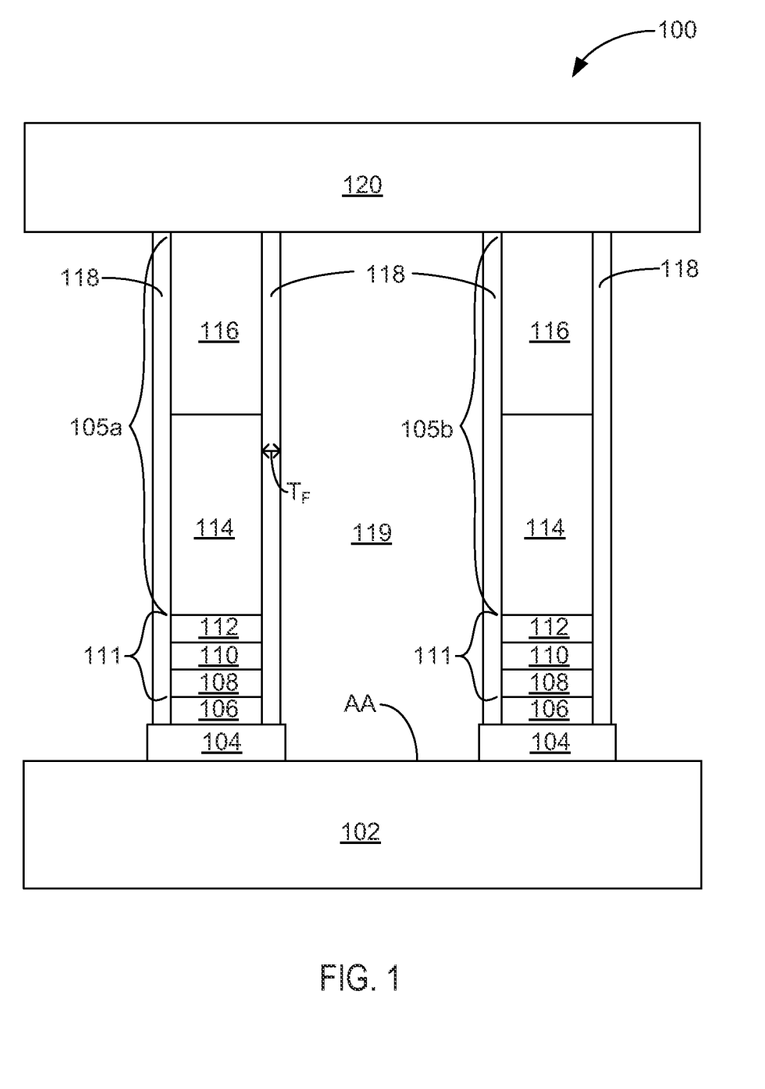
FIG. 1 schematically illustrates an example cross-section of a memory device in accordance with some embodiments.

FIG. 1 schematically illustrates an example cross-section of a memory device 100 in accordance with some embodiments. FIG. 1 may depict the memory device 100 subsequent to being etched after wordline (e.g., the wordline structure 105a) definition to improve data retention in the memory device 100. In some embodiments, the memory device 100 is a final product memory device that may be ready to ship to a customer. The memory device 100 includes a substrate 102; tunnel dielectric 104; charge storage node 106; inter-poly dielectric (IPD) stack 111 including layers 108, 110, and 112; wordline structure 105a including control gate 114, cap 116, and liner 118; air gap 119; and electrically insulative layer 120, coupled as shown. The memory device 100 may be a phase change memory (PCM) device including, for example, a phase change memory and switch (PCMS) device or a flash memory device. Subject matter is not limited in this regard, and the memory device 100 may include other types of memory devices that benefit from the principles described herein.

The substrate 102 may be composed of a semiconductor material such as, for example, silicon or germanium. In some embodiments, the substrate 102 is a substrate of a die formed on a semiconductor wafer.

The tunnel dielectric 104 may be formed on the substrate 102. In some embodiments, the tunnel dielectric 104 is composed of silicon oxide ($SiO_2$) or silicon nitride (SiN). The tunnel dielectric 104 may include other suitable materials in other embodiments.

The charge storage node 106 may be formed on the tunnel dielectric 104. The charge storage node 106 may include a floating gate or other charge trap structure of the memory device 100. The charge storage node 106 may be capacitively coupled to an active area (AA) of the substrate 102 through the tunnel dielectric 104. The charge storage node 106 may be composed of an electrically conductive material. In some embodiments, the charge storage node 106 is composed of metal and/or polysilicon. The charge storage node 106 may include silicon nitride in some embodiments. Other materials can be used to form the charge storage node 106 in other embodiments.

The IPD stack 111 may be formed on the charge storage node 106. In some embodiments, layer 108 is composed of $SiO_2$, layer 110 is composed of SiN, and layer 112 is composed of $SiO_2$ to provide an oxide-nitride-oxide (ONO) stack. The IPD stack 111 may include more or less layers than the depicted layers 108, 110, 112 and the IPD stack 111 may include other materials in other embodiments.

The control gate 114 may be formed on the IPD stack 111. The control gate 114 is part of the wordline structure 105a formed on the IPD stack 111. The control gate 114 may be composed of an electrically conductive material. In some embodiments, the control gate 114 is composed of a metal such as, for example, tungsten or nickel. The control gate 114 may be capacitively coupled to the charge storage node 106 through the IPD stack 111.

The cap 116 may be formed on the control gate 114. In some embodiments, the cap 116 is part of the wordline structure 105a. The cap 116 may be composed of an electrically insulative material such as, for example, $SiO_2$ or SiN. In some embodiments, the wordline structure 105a extends in a lengthwise direction in and out of the page of FIG. 1.

The liner 118 may be formed on sidewalls of the wordline structure 105a including on sidewalls of the control gate 114 and the cap 116, as can be seen. In some embodiments, the liner 118 may be formed on sidewalls of the IPD stack 111 and extend to the tunnel dielectric 104 such that the liner 118 is directly connected to the tunnel dielectric 104. The liner 118 may be composed of an electrically insulative material such as, for example, $SiO_2$ or SiN. In some embodiments, the liner 118 has a final thickness, $T_F$, of 20 Angstroms to 30 Angstroms. The liner 118 may be composed of different materials or have other thicknesses in other embodiments. The liner 118 may protect materials of the wordline structure 105a, the IPD stack 111, and/or the charge storage node 106 from oxidation. Further, the liner 118 may protect active areas (e.g., AA in FIG. 1) from contamination such as, e.g., metal particles from the control gate 114.

The electrically insulative layer 120 may be formed on the cap 116 of the wordline structures 105a, 105b such that the electrically insulative layer 120 bridges an air gap 119 disposed between the wordline structures 105a, 105b. The air of the air gap 119 may serve as a dielectric material between the wordline structures 105a, 105b. The memory device 100 formed using a post-wordline etch process to etch the liner 118 may provide a larger air gap 119 by removing material of the tunnel dielectric 104 such that the air gap 119 extends through the tunnel dielectric 104 to the substrate 102, in some embodiments. The larger air gap 119 may reduce charge loss between wordline structures 105a, 105b (e.g., by further capacitively decoupling the wordline structures 105a, 105b from one another). The larger air gap 119 may also capacitively decouple and thus reduce charge loss caused by capacitive coupling of other features such as the charge storage node 106 and/or IPD stack 111 of wordline structures 105a, 105b. An increased air gap 119 may increase a breakdown voltage of the memory device 100 and increase data retention in the memory device 100. In some embodiments, the electrically insulative layer 120 is composed of $SiO_2$ or SiN. Other suitable materials can be used in other embodiments.

In some embodiments, the memory device 100 is a flash memory device such as, for example, a NAND flash memory device. The subject matter of the present disclosure is not limited in this regard and the techniques and configurations described herein may be applied to other types of integrated circuit devices that benefit from the principles described herein. Although the features in FIGS. 1 and 2A-D are generally depicted as rectangular in shape, it is well understood that profiles of the depicted features may have non-rectangular profiles owing to process variations.

FIGS. 2A-D schematically illustrate a memory device 200 in fabrication subsequent to various operations in accordance with some embodiments. For example, the memory device 100 of FIG. 1 may be fabricated according to techniques described in connection with FIGS. 2A-D.

Figure 2A:
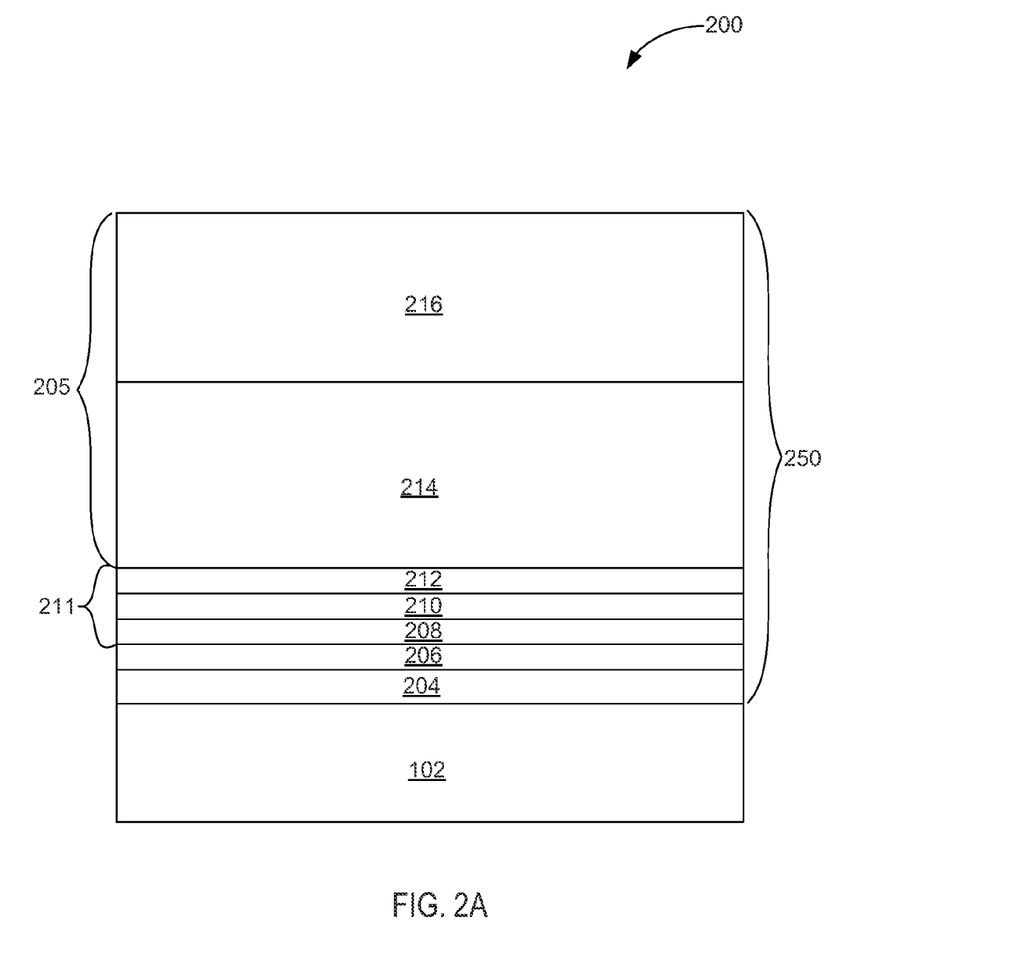
FIGS. 2A-D schematically illustrate a memory device in fabrication subsequent to various operations in accordance with some embodiments.

Referring to FIGS. 1 and 2A, the memory device 200 is depicted subsequent to forming a stack of layers 250 on substrate 102. The stack of layers (or simply "stack" 250) may include a tunnel dielectric layer 204 that is deposited to form the tunnel dielectric 104. The stack 250 may further include a charge storage node layer 206 that is deposited to form the charge storage node 106. The stack 250 may further include IPD stack layer 211 that is deposited as layers 208, 210, 212 to form the IPD stack 111 having respective layers 108, 110, 112. The stack 250 may further include a wordline structure layer 205 including control gate layer 214 that is deposited to form the control gate 114 and a cap layer 216 that is deposited to form the cap 116.

Layers of the stack 250 can be deposited using any suitable deposition technique including, for example, chemical vapor deposition (CVD), physical vapor deposition (PVD), and/or atomic layer deposition (ALD). Other suitable techniques may be used in other embodiments.

Figure 2B:
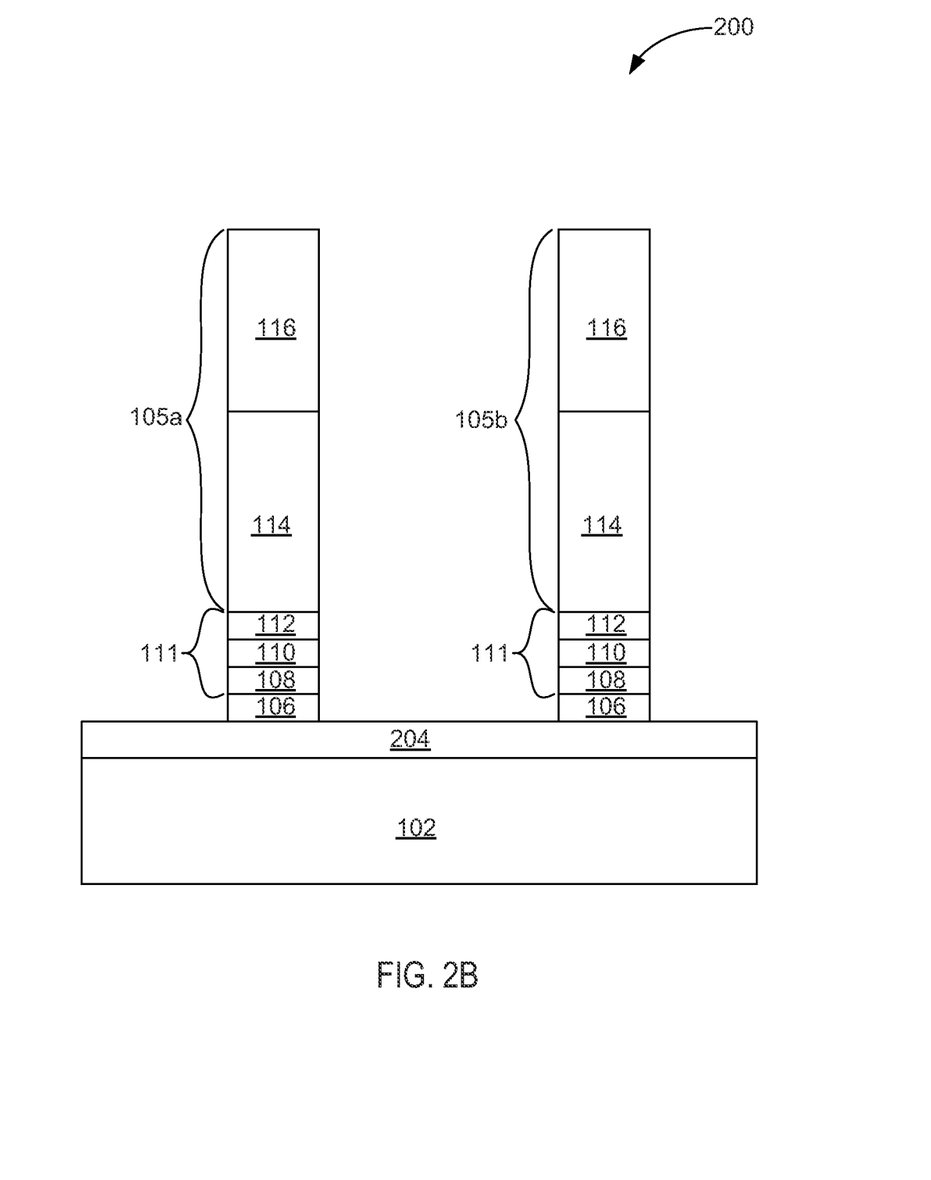

Referring to FIG. 2B, the memory device 200 is depicted subsequent to patterning operations that define the wordline structures 105a, 105b including the cap 116 and the control gate 114, the IPD stack 111 including the layers 108, 110, 112 and the charge storage node 106. The patterning operations may isolate the wordline structure 105a from the adjacent wordline structure 105b, as can be seen. The patterning operations may form a plurality of wordline structures (e.g., wordline structures 105a, 105b) on the substrate 102. The patterning operations can include, for example, multiple lithography and/or etch operations that remove material of the layers of stack 250 of FIG. 2. In some embodiments, the cap layer 216 of FIG. 2 serves as a hardmask layer for the patterning of underlying layers 214, 211, and 206.

Figure 2C:
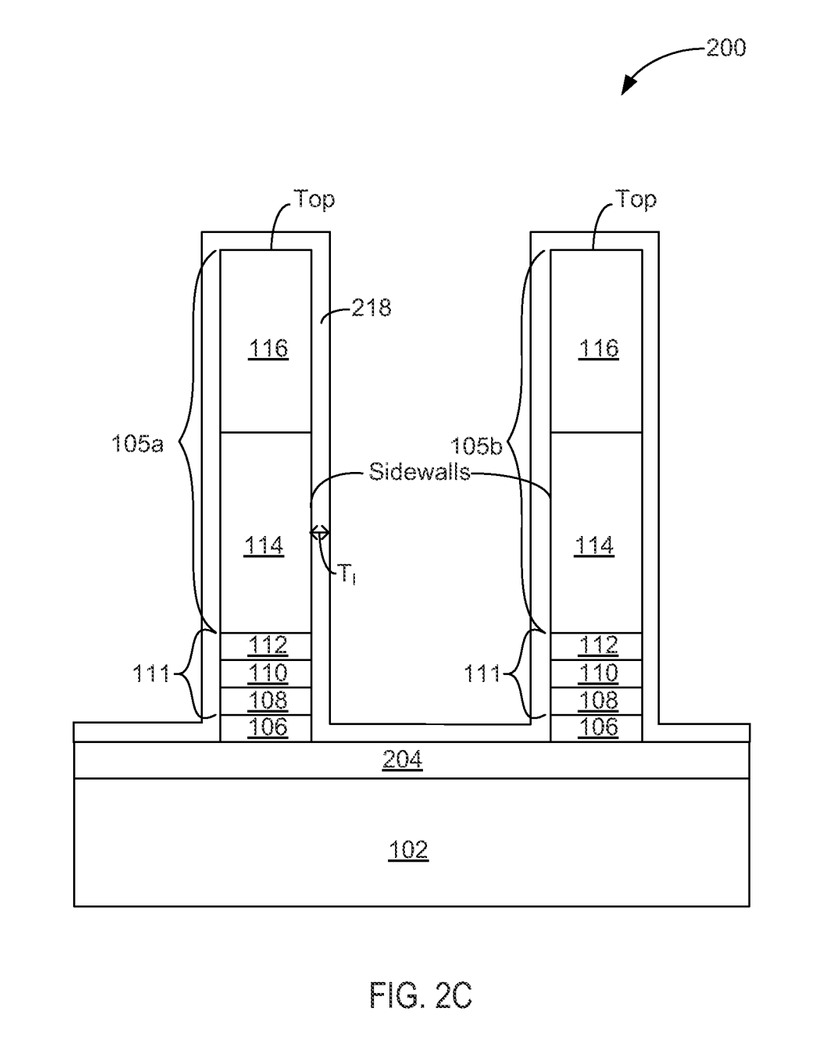

Referring to FIG. 2C, the memory device 200 is depicted subsequent to depositing an electrically insulative material to form a conformal liner 218 that is used to form the liner 118 of FIG. 1. In some embodiments, the conformal liner 218 may be conformally deposited on exposed surfaces of the tunnel dielectric layer 204, the charge storage node 106, the IPD stack 111, and the wordline structures 105a, 105b, including sidewall surfaces ("Sidewalls") and a top surface ("Top") as can be seen. The conformal liner 218 may be deposited using, for example, an ALD or CVD process including plasma-enhanced CVD (PECVD). In some embodiments, the conformal liner 218 may have a substantially uniform initial thickness, $T_I$, of 40 Angstroms to 50 Angstroms. Other suitable deposition techniques and/or thicknesses may be used in other embodiments.

Figure 2D:
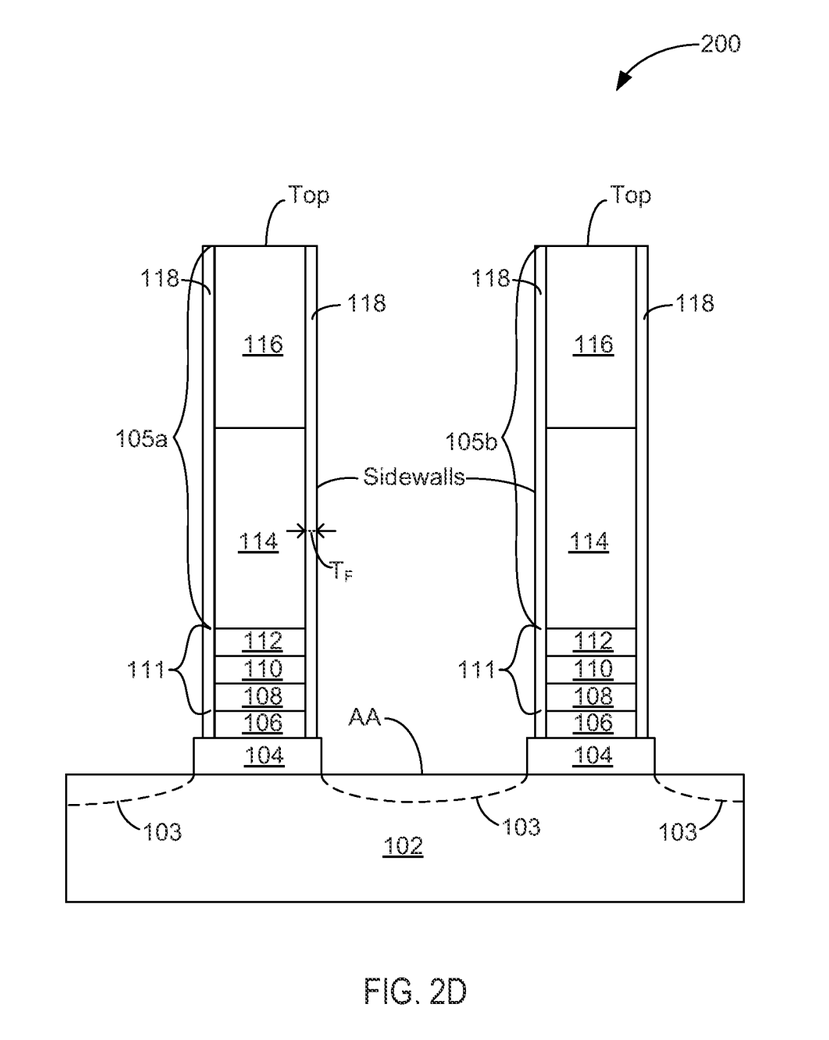

Referring to FIG. 2D, the memory device 200 is depicted subsequent to etching (e.g., post-wordline definition etch) the conformal liner 218 of FIG. 2C to remove at least a portion of the conformal liner 218. In some embodiments, the conformal liner 218 is substantially or completely removed from the top surface of the cap 116 to form the liner 118 on the sidewall surfaces of the wordline structures 105a, 105b, the IPD stack 111, and the charge storage node 106. The liner 118 on the sidewalls may have a reduced thickness relative to the conformal liner 218 owing to the etch process. In some embodiments, the final thickness, $T_F$, is 20 Angstroms to 30 Angstroms. The liner 118 may have other thicknesses in other embodiments.

The etch process used to etch the conformal liner 218 may be a dry etch process including fluorine-based ion/plasma etching processes. In some embodiments, the etch process is anisotropic to selectively etch horizontal surfaces (e.g., surfaces such as the top surface of the cap 116 that are substantially parallel to the surface on the substrate 102 upon which the wordline structures 105a, 105b are fabricated). The etch process may increase data retention (e.g., intrinsic, tail bits, etc.) of the memory device 100 by removing contaminants from the active area (AA) that may cause shorts in the memory device 100. Other etch chemistries or etch processes may be used in other embodiments. For example, in some embodiments, the dry etch process may be supplemented by a wet etch process to clean or remove potential contaminants from the memory device 200.

The etch process may remove the conformal liner 218 disposed on the tunnel dielectric layer 204 of FIG. 2C and may further remove a portion of the tunnel dielectric layer 204 to form the tunnel dielectric 104 such that the substrate 102 is at least partially exposed between the wordline structures 105a, 105b. In some embodiments, the etch process removes material of the substrate 102 to form recessed areas 103, demarcated by dashed lines, into the substrate 102. That is, the etch process may punch through the tunnel dielectric layer into the material of the substrate 102. The recessed areas 103 may be part of the memory device 100 of FIG. 1 in some embodiments, which may provide a larger air gap 119 area and further decouple the wordline structures 105a, 105b to decrease charge loss in the memory device 100. In some embodiments, a predetermined amount of the tunnel dielectric layer material in the active area (AA) between the wordline structures 105a, 105b is removed by the etch process. The predetermined amount may be in the range of about 20 Angstroms to 35 Angstroms. The predetermined amount is not limited in this regard and may have lower or higher values in other embodiments. That is, the etch process may remove some or exactly all of the material of the tunnel dielectric layer between the wordline structures 105a, 105b in some embodiments. In other embodiments, the etch process may further remove a portion of the substrate 102.

An electrically insulative layer (e.g., the electrically insulative layer 120 of FIG. 1) may be deposited on the top surface of the wordline structures 105a, 105b of FIG. 2D to form an air gap (e.g., the air gap 119 of FIG. 1). The formation of the electrically insulative layer may be subsequent to the etch process that removes at least a portion of the conformal liner 218 of FIG. 2C. In some embodiments, the electrically insulative layer may be formed using a non-conformal deposition process that selectively deposits on horizontal surfaces such as the top surface of the cap 116 more quickly than vertical surfaces to provide a "breadloaf" effect that causes deposited electrically insulative material on the cap 116 to bridge the space between the wordline structures 105a, 105b and form an air gap between the wordline structures 105a, 105b. The air gap can be formed according to other techniques in other embodiments.

Figure 3:
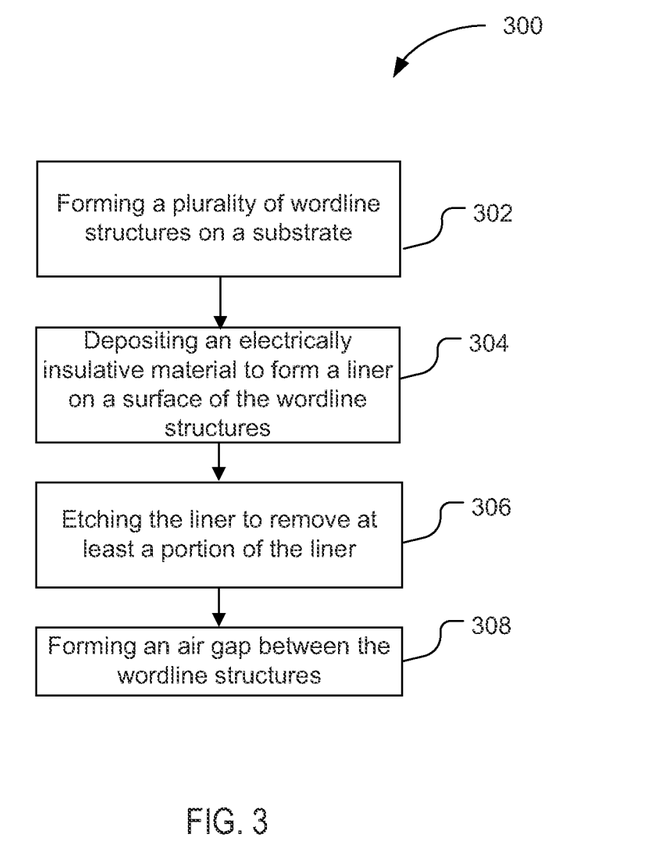
FIG. 3 is a flow diagram for a method of fabricating a memory device in accordance with some embodiments.

FIG. 3 is a flow diagram for a method 300 of fabricating a memory device (e.g., the memory device 100 of FIG. 1) in accordance with some embodiments. The actions at 302, 304, 306, and 308 may comport with embodiments already described in connection with FIG. 1 and FIGS. 2A-D.

At 302, the method 300 includes forming a plurality of wordline structures (e.g., the wordline structures 105a, 105b of FIG. 1) on a substrate (e.g., the substrate 102 of FIG. 1). In some embodiments, the plurality of wordline structures are formed by depositing an electrically conductive material to form a control gate layer (e.g., the control gate layer 214 of FIG. 2A) on a charge storage node layer (e.g., the charge storage node layer 206 of FIG. 2A) formed on the substrate. An electrically insulative material may be deposited on the control gate layer to form a cap layer (e.g., the cap layer 216 of FIG. 2A). A portion of the cap layer, the control gate layer, and the charge storage node layer may be removed, e.g., by a patterning process, to define the plurality of wordline structures and a plurality of charge storage nodes (e.g., the charge storage node 106 of FIG. 2B).

At 304, the method 300 further includes depositing an electrically insulative material to form a liner (e.g., the liner 118 of FIG. 1) on a surface of the wordline structures. In some embodiments, the electrically insulative material is deposited on sidewall surfaces of a control gate (e.g., the control gate 114 of FIG. 1) and the cap (e.g., the cap 116 of FIG. 1) and on a top surface of the cap. The deposition of the liner may be conformal in some embodiments.

At 306, the method 300 further includes etching the liner to remove at least a portion of the liner. In some embodiments, the liner is etched using an anisotropic dry etch process to substantially remove the deposited electrically insulative material of the liner from the top surface of the cap. The etching may reduce a thickness of the electrically insulative material of the liner on the sidewall surfaces of the wordline structures. In some embodiments, a thickness of the liner on the sidewalls is reduced from a thickness of 40-50 Angstroms to a thickness of 20-30 Angstroms. Subsequent to the etching, the electrically insulative material of the liner may substantially cover the sidewall surfaces of the wordlines. The etching process may remove a tunnel dielectric (e.g., the tunnel dielectric 104 of FIG. 1) material and may even remove a portion of material from the substrate disposed between the wordline structures.

At 308, the method further includes forming an air gap (e.g., the air gap 119 of FIG. 1) between the wordline structures. In some embodiments, the air gap is formed by selectively depositing an electrically insulative material on a top surface of the cap to form an electrically insulative layer (e.g., the electrically insulative layer 120 of FIG. 1). The electrically insulative layer bridges a pocket of air disposed between the wordline structures to form the air gap. The air of the air gap may serve as a dielectric material between the wordline structures.

Figure 4:
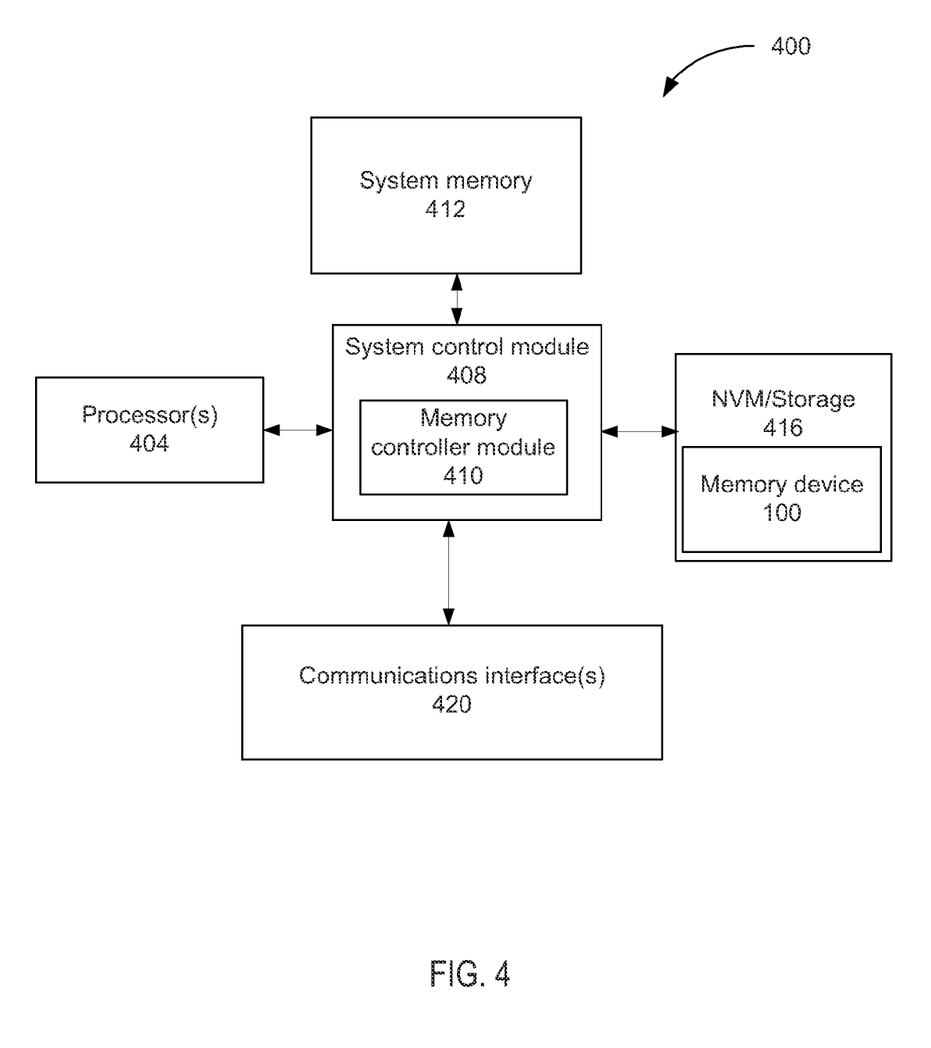
FIG. 4 schematically illustrates an example system that may include a memory device described herein in accordance with some embodiments.

Embodiments of the present disclosure may be implemented into a system using any suitable hardware and/or software to configure as desired. FIG. 4 schematically illustrates an example system 400 that may include a memory device 100 described herein in accordance with some embodiments. In one embodiment, the system 400 includes one or more processor(s) 404, system control module 408 coupled to at least one of the processor(s) 404, system memory 412 coupled to system control module 408, non-volatile memory (NVM)/storage 416 coupled to system control module 408, and one or more communications interface(s) 420 coupled to system control module 408.

System control module 408 for one embodiment may include any suitable interface controllers to provide for any suitable interface to at least one of the processor(s) 404 and/or to any suitable device or component in communication with system control module 408.

System control module 408 may include a memory controller module 410 to provide an interface to system memory 412. The memory controller module 410 may be a hardware module, a software module, and/or a firmware module.

System memory 412 may be used to load and store data and/or instructions, for example, for system 400. System memory 412 for one embodiment may include any suitable volatile memory, such as suitable DRAM, for example.

System control module 408 for one embodiment may include one or more input/output (I/O) controller(s) to provide an interface to NVM/storage 416 and communications interface(s) 420.

The NVM/storage 416 may be used to store data and/or instructions, for example. NVM/storage 416 may include any suitable non-volatile memory, such as phase change memory (PCM) or flash memory, for example, and/or may include any suitable non-volatile storage device(s), such as one or more hard disk drive(s) (HDD(s)), one or more compact disc (CD) drive(s), and/or one or more digital versatile disc (DVD) drive(s), for example. According to various embodiments, the NVM/storage 416 includes a memory device 100 as described herein.

An article of manufacture is disclosed. In some embodiments, the article of manufacture includes non-transitory storage such as, for example, the non-volatile memory (NVM)/storage 716. The article of manufacture may have instructions stored thereon, that if executed by a processor, cause the actions of methods described herein to be performed.

The NVM/storage 416 may include a storage resource physically part of a device on which the system 400 is installed or it may be accessible by, but not necessarily a part of, the device. For example, the NVM/storage 416 may be accessed over a network via the communications interface(s) 420.

Communications interface(s) 420 may provide an interface for system 400 to communicate over one or more wired or wireless network(s) and/or with any other suitable device.

For one embodiment, at least one of the processor(s) 404 may be packaged together with logic for one or more controller(s) of system control module 408, e.g., memory controller module 410. For one embodiment, at least one of the processor(s) 404 may be packaged together with logic for one or more controllers of system control module 408 to form a System in Package (SiP). For one embodiment, at least one of the processor(s) 404 may be integrated on the same die with logic for one or more controller(s) of system control module 408. For one embodiment, at least one of the processor(s) 404 may be integrated on the same die with logic for one or more controller(s) of system control module 408 to form a System on Chip (SoC).

In various embodiments, the system 400 may be, but is not limited to, a server, a workstation, a desktop computing device, or a mobile computing device (e.g., a laptop computing device, a handheld computing device, a handset, a tablet, a netbook, etc.). In various embodiments, the system 400 may have more or less components, and/or different architectures.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. A method comprising:
   forming a plurality of wordline structures on a substrate, wherein individual wordline structures of the plurality of wordline structures include a control gate having an electrically conductive material and a cap having a first electrically insulative material formed on the control gate;
   depositing a second electrically insulative material to form a liner on a surface of the individual wordline structures, on sidewall surfaces of the control gate and the cap, and on a top surface of the cap; and
   etching the liner to remove at least a portion of the liner using an anisotropic dry etch process to substantially remove the second electrically insulative material of the liner from the top surface of the cap, wherein the etching reduces a thickness of the second electrically insulative material of the liner on the sidewall surfaces of the individual wordline structures such that the second electrically insulative material of the liner substantially covers the sidewall surfaces of the individual wordline structures subsequent to the etching,
   wherein the substrate includes a semiconductor material, a tunnel dielectric is disposed on the semiconductor material and wherein the etching removes a portion of the tunnel dielectric and the semiconductor material of the substrate and
   subsequent to etching the liner, forming an air gap between the individual wordline structures of the plurality of wordline structures.

2. The method of claim 1, wherein forming the plurality of wordline structures includes:
   depositing the electrically conductive material to form a control gate layer on a charge storage node layer formed on the substrate;
   depositing the first electrically insulative material on the control gate layer to form a cap layer coupled with the control gate layer; and
   removing at least a portion of the cap layer, the control gate layer, and the charge storage node layer to define the plurality of wordline structures and a plurality of charge storage nodes.

3. The method of claim 1, wherein the etching reduces a thickness of the second electrically insulative material of the liner on the sidewall surfaces of the individual wordline structures to a thickness of 20 Angstroms to 30 Angstroms.

4. The method of claim 1, wherein forming the air gap includes:
  selectively depositing a third electrically insulative material on a top surface of the cap such that the third electrically insulative material deposited on the top surface of the cap bridges air disposed between the individual wordline structures to form the air gap between the individual wordline structures.

5. The method of claim 1, wherein:
  the liner includes silicon oxide ($SiO_2$) or silicon nitride (SiN);
  the cap includes silicon oxide ($SiO_2$) or silicon nitride (SiN);
  the control gate includes a metal; and
  the substrate includes silicon (Si).

* * * * *